US005563553A

United States Patent [19]
Jackson

[11] Patent Number: 5,563,553
[45] Date of Patent: Oct. 8, 1996

[54] METHOD AND APPARATUS FOR A CONTROLLED OSCILLATION THAT MAY BE USED IN A PHASE LOCKED LOOP

[75] Inventor: Harry S. Jackson, Austin, Tex.

[73] Assignees: SigmaTel Inc., Austin; Dallas Semiconductor Corp., Dallas, both of Tex.

[21] Appl. No.: 515,415

[22] Filed: Aug. 15, 1995

[51] Int. Cl.$^6$ .............................. H03B 5/24; H03L 7/099
[52] U.S. Cl. .............................. 331/57; 331/34; 331/175; 331/177 R; 327/157
[58] Field of Search .................................. 331/34, 57, 74, 331/111, 143, 175, 177 R; 327/156, 266, 157, 274, 105, 280; 375/287, 376; 455/260

[56] References Cited

U.S. PATENT DOCUMENTS

| | | | |
|---|---|---|---|
| 5,180,995 | 1/1993 | Hayashi et al. | 331/186 X |
| 5,412,349 | 5/1995 | Young et al. | 331/34 |
| 5,467,060 | 11/1995 | Miyashita | 331/34 X |
| 5,469,120 | 11/1995 | Nguyen et al. | 331/34 X |

OTHER PUBLICATIONS

"PLL Clock Generator with 5 to 110 MHz of Lock Range for Microprocessors," Young, et al., *IEEE Journal of Solid-State Circuits*, vol. 27, No. 11, Nov. 1992, pp. 1599–1607.

"MOS Oscillators with Multi–Decade Tuning Tange and Gigahertz Maximum Speed," Banu, *IEEE Journal of Solid-State Circuits*, vol. 23, No. 6, Dec. 1988, pp. 1386–1393.
"Design of PLL–Based Clock Generation Circuits," Jeong, et al, *IEEE Journal of Solid–State Circuits*, vol. SC–22, No. 2, Apr. 1987, pp. 255–261.

*Primary Examiner*—David Mis
*Attorney, Agent, or Firm*—Jenkens & Gilchrist

[57] ABSTRACT

A method and apparatus for a controlled oscillator which may be incorporated in a phase locked loop is accomplished by including a current controlled reference, a current mirror and a plurality of inverters that form a ring oscillator within the controlled oscillator. The controlled reference provides a current control signal to the current mirror, which, in turn, provides a load control signal to each inverter of the ring oscillator. Each inverter is characterized by a differential load section which includes a pair of load transistors for receiving the load control signal and for providing a current source from the load control signal and a pair of clamping transistors configured to provide a non-linear clamping circuit which limits the voltage range of a differential output. The load transistors are connected in parallel with the clamping transistors to provide a linear differential output. The load control signal dynamically regulates the impedance of the differential load section such that the controlled oscillator may stably operate at any frequency and be produced without performance variations due to variances in the fabrication process.

14 Claims, 3 Drawing Sheets

METHOD AND APPARATUS FOR A CONTROLLED OSCILLATION THAT MAY BE USED IN A PHASE LOCKED LOOP

TECHNICAL FIELD OF THE INVENTION

This invention relates generally to voltage controlled oscillators that are used in phase locked loops and more particularly to a controlled oscillation that includes a ring oscillator.

BACKGROUND OF THE INVENTION

Phase locked loops (PLL) are known to be used in a wide variety of electronic equipment. For example, PLLs are used in telecommunication equipment, microprocessors, microcontroller, etc. to provide an output oscillation signal that is locked in phase, i.e., synchronized, with an incoming oscillating signal. By locking the output oscillation signal with the incoming oscillating signal, which may be digital signal representing data or an external clock signal, information can be extracted from the incoming oscillation signal, or an incoming signal, with minimal risk of data loss.

A PLL performs the locking function by receiving the incoming oscillating signal and comparing it with a feedback signal. This comparison is performed by a phase detector which provides a charge up signal when the incoming oscillating signal leads the feedback signal (is operating at a faster frequency) or a charge down signal when the incoming oscillation signal lags the feedback signal (is operating at a slower frequency). A charge pump receives the charge up or charge down signal and produces a control voltage therefrom. In general, the charge pump functions like a capacitor, where the charge up signal increases the voltage across the capacitor and the charge down signal decreases the voltage.

A voltage controlled oscillator (VCO) generates the output oscillation signal in response to the control voltage. The VCO includes an odd number of inverters interoperably coupled to provide a ring oscillation, where each inverter provides a controlled delay. The control signal regulates the delay of each inverter such that the overall delay of the ring oscillator matches, is some multiple of, or is some fraction of the frequency of the incoming oscillation signal. The output oscillation signal is fed back to the phase detector via a feedback divider to produce the feedback signal.

As is known, PLLs are being incorporated on integrated circuits (IC) to help increase the operating rates of many ICs. As the operating rates increase, control of the inverter delays becomes an ever increasing problem. One implementation to more precisely control the inverter delays is disclosed in IEEE Journal of Solid State Circuits, Vol 27, No. 11, November 1992, page 1599, entitled "A PLL Clock Generator with 5 to 110 MHz of Lock Range for Microprocessors", authored by Young, Greason, and Wong. In their paper, Young et al. disclose controlling the inverters of a ring oscillator via a replica inverter stage. The replica inverter is staticly biased to produce a gate control voltage for each of the inverters in the ring oscillator. While this static approach works well in many applications, it is process dependent, thus yielding different responses from different process batches. In addition, this approach becomes unstable at low frequencies.

Therefore, a need exists for a method and apparatus of a controlled oscillator that provides a dynamic gate control signal and is stable at low frequencies.

DETAILED DESCRIPTION OF THE DRAWINGS

Generally, the present invention provides a method and apparatus for a controlled oscillator which may be incorporated in a phase locked loop. This is accomplished by including, within the controlled oscillator, a current controlled reference, a current mirror, and a plurality of inverters that form a ring oscillator. The controlled reference provides a current control signal to the current mirror, which, in turn, provides a load control signal to each inverter of the ring oscillator. The load control signal dynamically regulates the impedance of the inverters such that the controlled oscillator may stably operate at any frequency and be produced without performance variations due to variances in the fabrication process. In addition, the present invention provides clamping transistors within the differential load section to provide a stable amplitude of the controlled oscillator.

Figure 1:
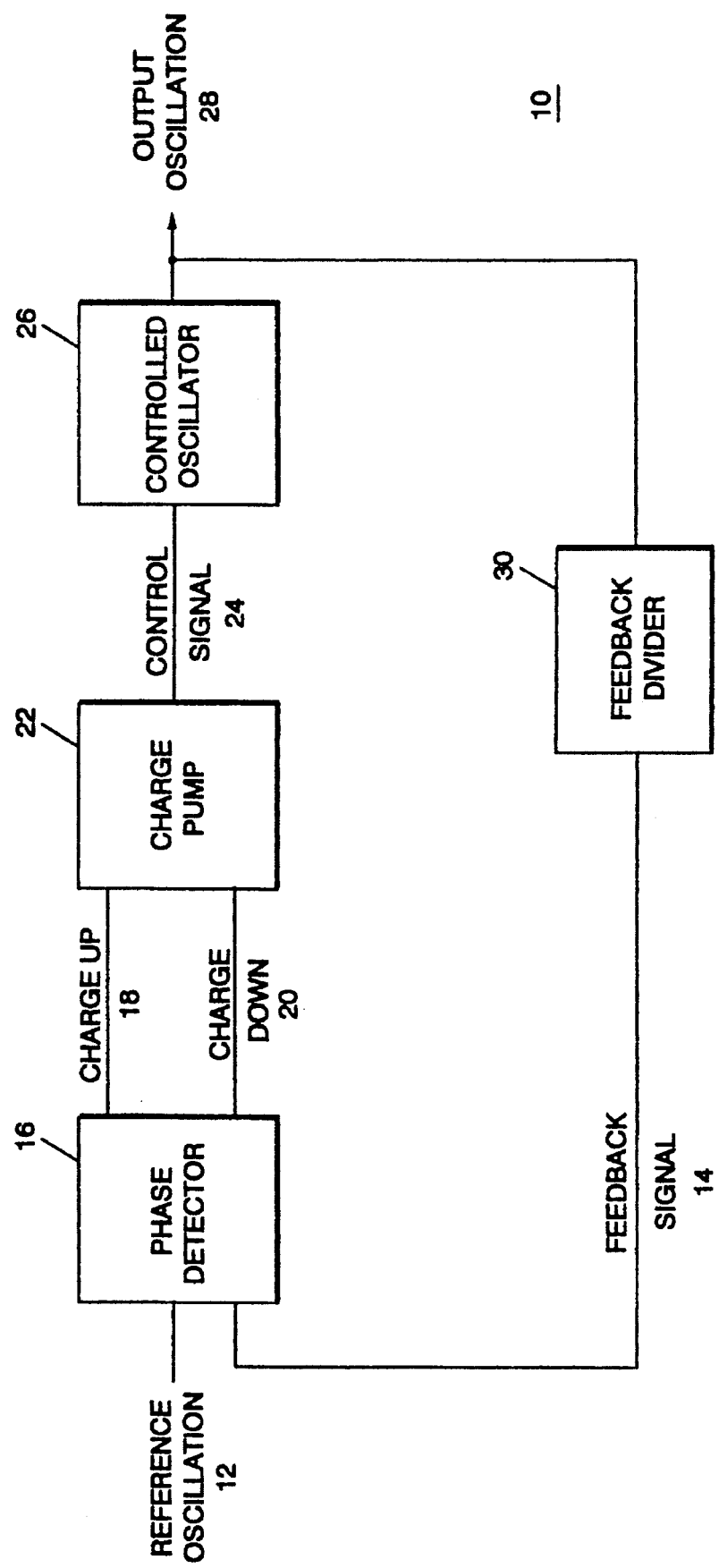
FIG. 1 illustrates a schematic block diagram of a phase locked loop having a controlled oscillator in accordance with the present invention.

FIG. 1 illustrates a schematic block diagram of a phase locked loop (PLL) 10 that may be implemented on an integrated circuit, as part of an integrated circuit, or using discrete components. Regardless of the implementation, the PLL 10 includes a phase detector 16, a charge pump 22, a controlled oscillator 26, and a feedback divider 30. In operation, the phase detector 16 receives a reference oscillation 12 and a feedback signal 14, where the reference oscillation may be an incoming data signal, an external clock signal, or any other type of digital oscillatory signal. From these inputs, the phase detector 16 generates a charge up signal 18 when the reference oscillation 12 is operating at a faster rate than the feedback signal 14 and generates a charge down signal 20 when the reference oscillation 12 is operating at a slower rate than the feedback signal 14.

The charge pump 22 utilizes the charge up signal 18 and the charge down signal 20 to generate a control signal 24. In the preferred embodiment, the control signal 24 will be a voltage, however, as one skilled in the art will readily appreciate, the control signal could be a current signal. For a voltage control signal 24, the charge pump 22 includes a capacitor which increases its charge when the charge up signal 18 is received, thus increasing the control signal 24. Conversely, the capacitor decreases its charge when the charge down signal 20 is received, thus decreasing the control signal 24.

The controlled oscillator 26 uses the control signal 24 to generate an output oscillation 28 having a frequency dependent upon the frequency of the reference oscillation 12. As such, the frequency of the output oscillation 28 may be a multiple, a fraction, or identical to the frequency of the reference oscillation 12 which is determined by the feedback divider 30. For example, if the feedback divider 30 is divide by 2, the frequency of the feedback signal 14 will be one-half the frequency of the output oscillation 28. Being a closed looped system, the feedback signal 14 is regulated to be identical to the reference oscillation 12, thus, the frequency of the output oscillation is forced, or regulated, to be twice the frequency of the reference oscillation. To maintain regulation, the control signal 24 increases as the frequency of the feedback signal 14 drops below the frequency of the reference oscillation 12 such that the controlled oscillator increases the frequency of the output oscillation 28. Conversely, the control signal 24 decreases as the frequency of the feedback signal 14 rises above the frequency of the reference oscillation 12 such that the controlled oscillator 26 decreases the frequency of the output oscillation 28.

Figure 2:
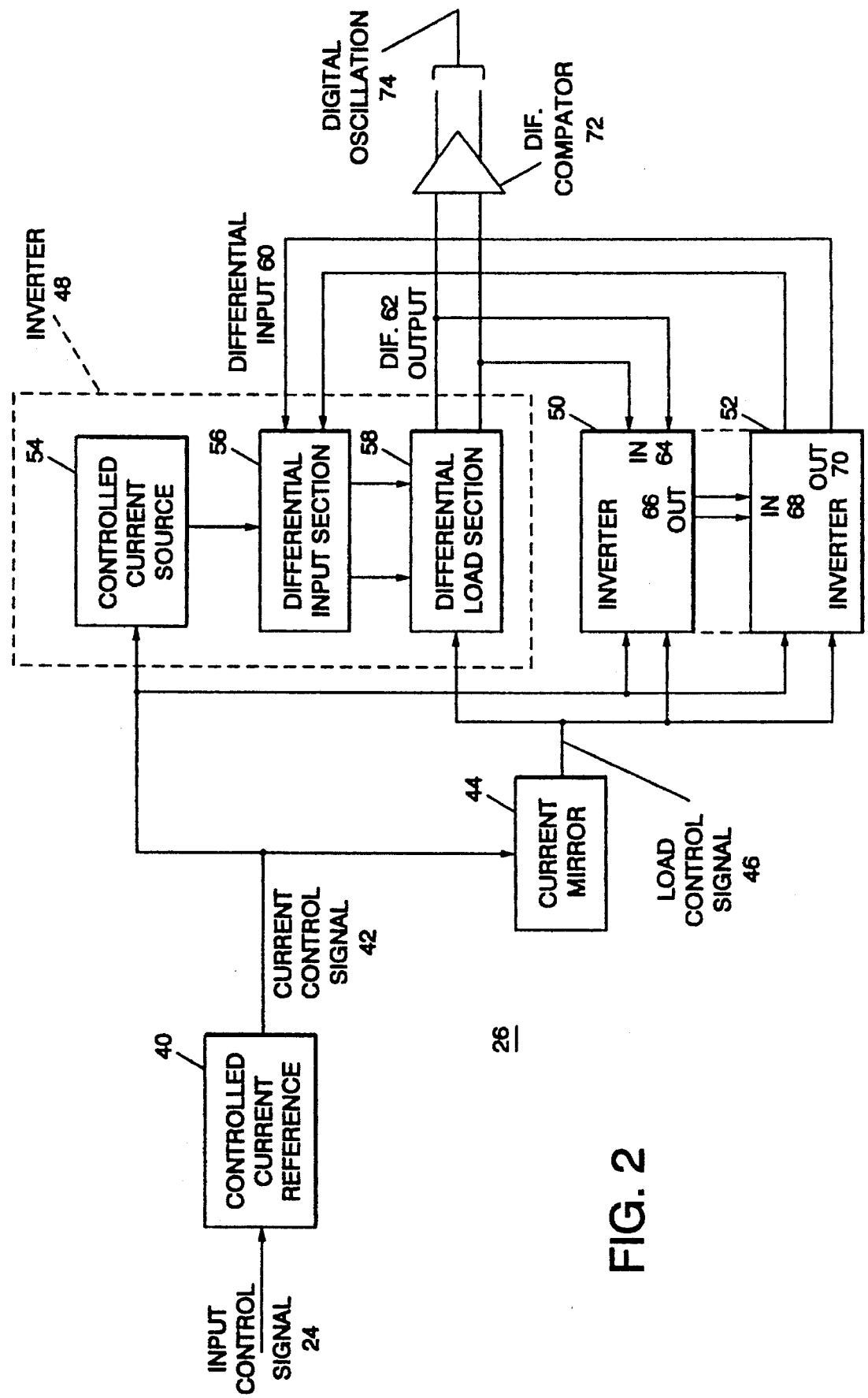
FIG. 2 illustrates a schematic block diagram of the controlled oscillator of FIG. 1.

FIG. 2 illustrates a schematic block diagram of the controlled oscillator 26 which incorporates features of the present invention. As shown, the controlled oscillator 26 includes a controlled current source reference 40, a current mirror 44, a plurality of inverters 48–52, and a differential comparator 72. The controlled current reference 40 receives the input control signal 24 from the charge pump 22 of FIG. 1 and generates a current control signal 42 therefrom. In general, the current control signal 42 is used to regulate dependent current sources 54 within the inverters 48–52. If the control signal 24 is decreasing (i.e., indicating that the frequency of the output oscillation 28 needs to be decreased), the current control signal 42 increases causing the dependent current sources 54 to decrease the current they supply. Conversely, when the control signal is increasing (i.e., indicating that the frequency of the output oscillation 28 needs to be increased), the current control signal 42 decreases causing the dependent current sources 54 to increase the current they supply.

In addition to supplying the current control signal 42 to the dependent current sources 54 of the plurality of inverters 48–52, the current control signal 42 is supplied to the current mirror 44. The current mirror 44 uses the current control signal 42 to generate a load control signal 46 which is supplied to the differential load section 58 of each of the inverters 48–52. The load control signal 46 regulates the impedance of the differential load section 58 based on the current control signal 42 and the input control signal 24. By regulating the differential load section 58 in this manner, dynamic control of the inverters is obtained, thus, making the controlled oscillator 26 and the PLL 10 relatively immune to process variations and allows such circuits to stably operate over a wide frequency range.

Each of the plurality of inverters 48–52 includes a controlled current source 54, a differential input section 56, and a differential load section 58. As mentioned, the controlled current source 54 is a dependent current source that supplies a current based on the current control signal 42. As the current control signal 42 increases, the current supplied by the controlled current source 54 decreases, which increases the delay for the inverter.

The current produced by the controlled current source 54 is supplied to the differential input section 56, which includes a differential input 60. The differential input section 56 divides the current supplied by the controlled current source 54 based on signals present at the differential input 60. The divided currents are supplied to the differential load section 58, which includes a differential output 62. The differential load section 58, based on the divided currents and the load control signal 46, provides output signals via the differential output 62.

The differential input 60 receives signals from the differential output 70 of inverter 52, while the differential output 62 provides signals to the differential input 64 of inverter 50. The differential output 62 also supplies signals to the differential comparator 72 which produces a digital oscillation. The differential output 66 of inverter 50 provides signals to the differential input 68 of inverter 52. Being coupled in this manner, the inverters 48–52 provide a ring oscillation function.

Figure 3:
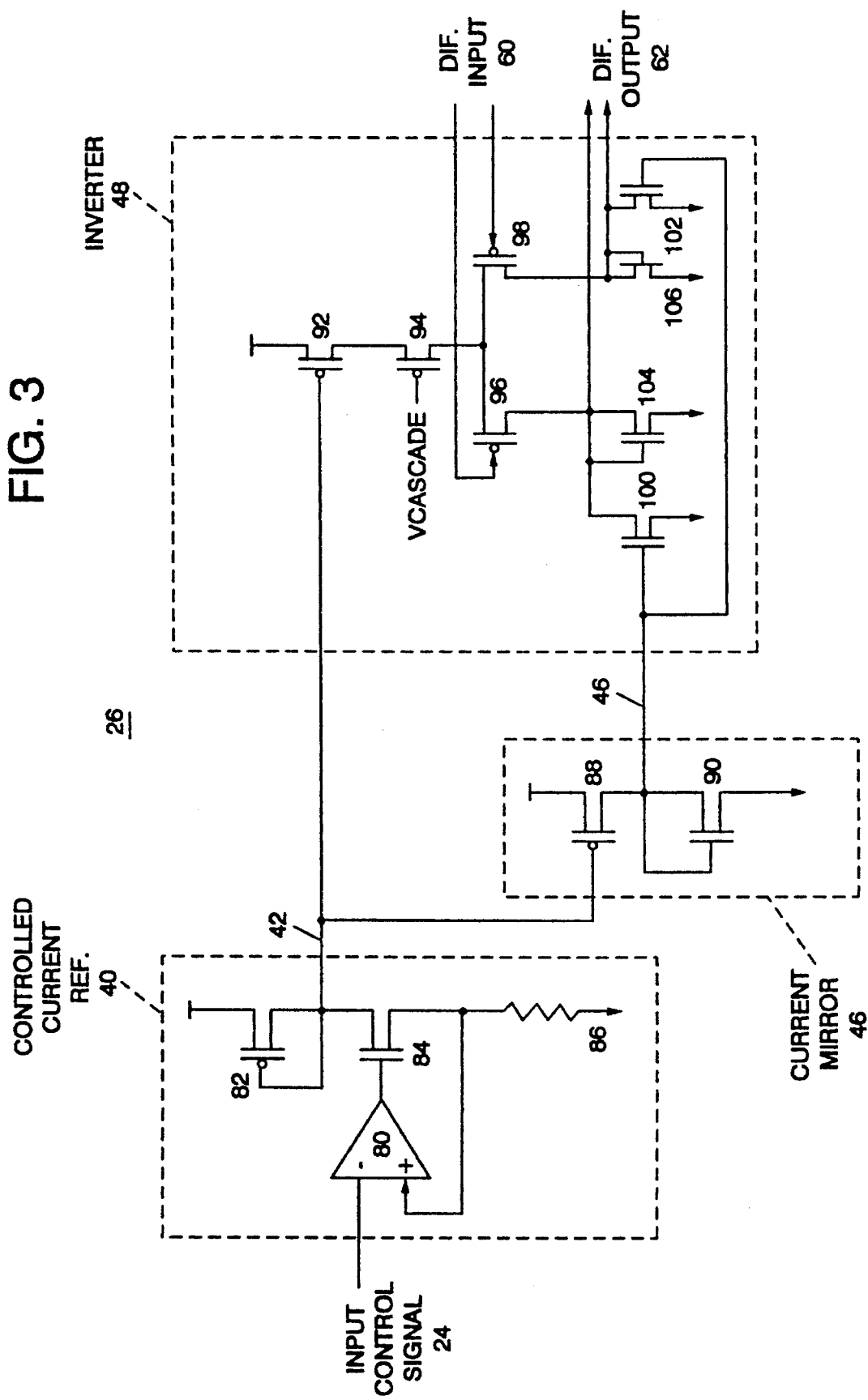
FIG. 3 illustrates a schematic of the controlled oscillator of FIG. 1.

FIG. 3 illustrates a schematic diagram of an embodiment of the controlled oscillator 26. The controlled oscillator 26 includes the current controlled reference 40, the current mirror 44, a plurality of inverters interoperably coupled to provide a ring oscillator 48 (only one shown). The controlled current reference 40 includes an operational amplifier 80 which is coupled in a source follower manner with N-channel Field Effect Transistor (FET) 84. An input of the operational amplifier 80 receives the input control signal 24. The controlled current reference 40 also includes a resistor 86 and a current source 82, which is depicted as a P-channel FET. In essence, the controlled current reference 40 functions as a voltage-to-current converter, by converting the input control signal 24 into a current flowing through resistor 86. The current source 82 is self biased to match the current flowing through the resistor 86 and, as such, produces the current control signal 42.

The current mirror 44 includes a current source 88, which is depicted as a P-channel FET, and a load 90, which is depicted as an N-channel FET. The current source 88 is regulated by the current control signal 42 to supply a scaled current of the current flowing through the resistor 86. Depending on transistor scaling between the P-channel FET 82 and the P-channel FET 88, the P-channel FET 88 may supply the same, more, or less current than is flowing through the resistor 86.

The load 90 receives the current supplied by the current source 88, and being self biased, the load uses the current to produce the load control signal 46. In particular, the load 90 establishes a gate-source voltage (Vgs) and drain-source voltage (Vds) to support the drain current. Thus, Vgs of the self biased load 90 provides the load control signal 46.

The inverter 48 includes a current source 92, a cascade transistor 94, differential input transistors 96, 98, load transistors 100, 102, and clamping transistors 104, 106. The current source 92 is scaled to the current source 88 of the current mirror 44. Thus, the current source 92 may supply the same, more, or less current than the current source 88. The current provided by the current source 92 is divided between the two differential input transistors 96, 98. If the input to transistor 96 is less than the input to transistor 98, a majority of the current will flow through transistor 96. Conversely, when the input to transistor 98 is less than the input to transistor 96, a majority of the current will flow through transistor 98.

The load transistors 100, 102 are scaled transistors with respect to the load 90 of the current mirror 44. As such, characteristics of the load transistors 100, 102 will be scaled representations of the characteristics of the load 90, i.e., will have the same impedance, less impedance, or more impedance than that of the load 90. The drains of the load transistors 100, 102 provide the differential output 62. When a majority of the current is flowing through input transistor 96, Vds of transistor 100 will be high (approximately 1 volt, depending on the threshold voltage of transistor 104), while Vds of transistor 102 will be low (approximately 0 volts). Each of the load transistors 100, 102 being a proportional version of the current sourcing transistor. The range of the differential output is clamped by clamping transistors 104, 106. When active, the clamping transistors 104, 106 act as diodes, clamping the maximum positive swing to their threshold voltage.

With the load transistors 100, 102 being a scaled version of the load 90 of the current mirror 44, the impedances of the load transistors are a function of the current being supplied via the current source 92. This makes the circuit relatively immune to process variations, since each transistor will experience similar variations within any given circuit. Additionally, such a configuration allows the present circuit to be stably operated over a wide frequency range, which was not achievable with prior art circuits.

What is claimed is:

1. A controlled oscillator comprising:

controlled current reference that produces a current control signal from an input control signal;

current mirror operably coupled to the controlled current reference, the current mirror generates a load control signal from the current control signal;

a plurality of inverters interoperably coupled to provide a ring oscillation, each of the plurality of inverters includes:

controlled current source operably coupled to receive the current control signal, the controlled current source produces a current based on the current control signal;

differential input section operably coupled to the controlled current source, the differential input section receives a differential input from another one of the plurality of inverters; and differential load section operably coupled to the differential input section to receive the load control signal, the differential load section provides a differential output based on the differential input and the load control signal and includes load transistors for receiving the load control signal and for providing a current source from the load control signal and clamping transistors configured to provide a non-linear clamping circuit which limits the voltage range of the differential output wherein the load transistors are connected in parallel with the clamping transistors to provide a linear differential output.

2. The controlled oscillator of claim 1, wherein each of the plurality of inverters further comprises a cascode transistor for increasing the output impedance of the controlled current source to thereby allow less variation in current based on variations in the voltage across the controlled current source, wherein the cascode transistor is operably coupled between the controlled current source and the differential input section and wherein each of the cascode transistors are operably coupled together.

3. The controlled oscillator of claim 1 further comprises a differential comparator operably coupled to receive a differential signal from an output of the plurality of inverters, the differential comparator produces a digital oscillation from the differential signal.

4. The controlled oscillator of claim 1, wherein the input control signal is a voltage control signal such that the controlled oscillator functions as a voltage controlled oscillator.

5. The controlled oscillator of claim 1, wherein the controlled current reference further comprises:

load impedance;

first transistor operably coupled to the load impedance and to receive the input control signal; and second transistor operably coupled to the first transistor, interconnection of the first and second transistors provide the current control signal.

6. The controlled oscillator of claim 5, wherein the controlled current reference further comprises an operational amplifier coupled to receive the input control signal and coupled to the first transistor in a follower manner.

7. A controlled oscillator comprising:

controlled current reference that produces a current control signal from an input control signal;

current mirror operably coupled to the controlled current reference, the current mirror generates a load control signal from the current control signal;

a plurality of inverters interoperably coupled to provide a ring oscillation based on the load control signal and the current control signal, each of the plurality of inverters includes:

controlled current source operably coupled to receive the current control signal, the controlled current source produces a current based on the current control signal;

differential input section operably coupled to the controlled current source, the differential input section receives a differential input from another one of the plurality of inverters; and differential load section operably coupled to the differential input section to receive the load control signal, the differential load section provides a differential output based on the differential input and the load control signal and includes load transistors for receiving the load control signal and for providing a current source from the load control signal and clamping transistors configured to provide a non-linear clamping circuit which limits the voltage range of the differential output wherein the load transistors are connected in parallel with the clamping transistors to provide a linear differential output; and differential comparator operably coupled to an output of the plurality of inverters to receive a differential signal, the differential comparator produces a digital oscillation from the differential signal.

8. A phase locked loop comprising:

phase detector that receives a feedback signal and a reference oscillation and produces therefrom a charge up signal or a charge down signal;

charge pump operably coupled to receive the charge up signal and the charge down signal, the charge pump produces a control signal from the charge up signal and the charge down signal;

controlled oscillator that includes:

controlled current reference that produces a current control signal from the control signal;

current mirror operably coupled to the controlled current reference, the current mirror generates a load control signal from the current control signal;

a plurality of inverters interoperably coupled to provide a ring oscillation, each of the plurality of inverters includes:

controlled current source operably coupled to receive the current control signal, the controlled current source produces a current based on the current control signal;

differential input section operably coupled to the voltage controlled current source, the differential input section receives a differential input from another one of the plurality of inverters; and differential load section operably coupled to the differential input section to receive the load control signal, the differential load section provides a differential output based on the differential input and the load control signal and includes load transistors for receiving the load control signal and for providing a current source from the load control signal and clamping transistors configured to provide a non-linear clamping circuit which limits the voltage range of the differential output wherein the load transistors are connected in parallel with the clamping transistors to provide a linear differential output; and feedback divider operably coupled to the controlled oscillator, the feedback divider generates the feedback signal from the differential output.

9. The phase lock loop of claim 8 further comprises being implemented on an integrated circuit.

10. A phase locked loop comprising:

phase detector that receives a feedback signal and a reference oscillation and produces therefrom a charge up signal or a charge down signal;

charge pump operably coupled to receive the charge up signal and the charge down signal, the charge pump produces a control signal from the charge up signal and the charge down signal;

controlled oscillator that includes:
   controlled current reference that produces a current control signal from the control signal;
   current mirror operably coupled to the controlled current reference, the current mirror generates a load control signal from the current control signal;
   a plurality of inverters interoperably coupled to provide a ring oscillation based on the load control signal and the current control signal, each of the plurality of inverters includes:
      controlled current source operably coupled to receive the current control signal, the controlled current source produces a current based on the current control signal;
      differential input section operably coupled to the controlled current source, the differential input section receives a differential input from another one of the plurality of inverters; and
      differential load section operably coupled to the differential input section and to receive the load control signal, the differential load section provides a differential output based on the differential input and the load control signal and includes load transistors for receiving the load control signal and for providing a current source from the load control signal and clamping transistors configured to provide a non-linear clamping circuit which limits the voltage range of the differential output wherein the load transistors are connected in parallel with the clamping transistors to provide a linear differential output; and differential comparator operably coupled to an output of the plurality of inverters to receive a differential signal, the differential comparator produces a digital oscillation from the differential signal; and feedback divider operably coupled to the controlled oscillator, the feedback divider generates the feedback signal from the differential output.

11. The phase locked loop of claim 10 further comprises being implemented on an integrated circuit.

12. A voltage controlled oscillator comprising:

reference transistors interoperably coupled to function as a current mirror, a first transistor of the reference transistors receives a control signal and generates a reference current therefrom, a second transistor of the reference transistors converts the reference current into a reference voltage;

a plurality of inverters interoperably coupled to provide a ring oscillation, each of the plurality of inverters includes:
   current sourcing transistor operably coupled to receive the control signal and produce a current therefrom, the current sourcing transistor is a scaled version of the first transistor;
   differential input transistors operably coupled to the current sourcing transistor, the differential input transistors receive a differential input; and
   load transistors operably coupled to the differential input transistors and to receive the reference voltage, the load transistors provide a differential output based on the differential input and the reference voltage, each of the load transistors being a scaled version of the second transistor and a proportional version of the current sourcing transistor; and
   load clamping transistors configured to provide a non-linear clamping circuit which limits the voltage range of the differential output wherein the load transistors are connected in parallels with the clamping transistors such that differential output is linear.

13. The voltage controlled oscillator of claim 12, wherein each of the plurality of inverters further comprises clamping transistors operably coupled to the load transistors.

14. The voltage control oscillator of claim 12, wherein each of the plurality of inverters further comprises a cascode transistor for increasing the output impedance of the controlled current source to thereby allow less variation in current based on variations in the voltage across the controlled current source, wherein the cascode transistor is operably coupled between the controlled current source and the differential input section and wherein each of the cascode transistors are operably coupled together.

* * * * *

UNITED STATES PATENT AND TRADEMARK OFFICE
CERTIFICATE OF CORRECTION

PATENT NO. : 5,563,553

DATED : October 8, 1996

INVENTOR(S) : Jackson

It is certified that error appears in the above-indentified patent and that said Letters Patent is hereby corrected as shown below:

Column 8, line 37  Delete "parallels"
Insert --parallel--

Signed and Sealed this

Seventeenth Day of June, 1997

Attest:

BRUCE LEHMAN

Attesting Officer    Commissioner of Patents and Trademarks